United States Patent [19]

Hidaka

[11] 4,091,330

[45] May 23, 1978

[54] CIRCUIT AND METHOD FOR DEMODULATING A FREQUENCY MODULATED SIGNAL

[75] Inventor: Tsuneyoshi Hidaka, Cupertino, Calif.

[73] Assignee: Ampex Corporation, Redwood City, Calif.

[21] Appl. No.: 833,773

[22] Filed: Sep. 15, 1977

[51] Int. Cl.² .......................... H03D 3/00; H03K 9/06
[52] U.S. Cl. .................................... 329/107; 325/349; 329/126
[58] Field of Search ............... 329/104, 105, 107, 110, 329/126, 127, 128; 325/321, 322, 344, 349

[56] References Cited

U.S. PATENT DOCUMENTS

| 3,502,995 | 3/1970 | Cottatellucci et al. | 329/126 |
| 3,745,468 | 7/1973 | Allner et al. | 329/126 X |
| 3,863,161 | 1/1975 | Johnson et al. | 329/110 X |

*Primary Examiner*—Siegfried H. Grimm
*Attorney, Agent, or Firm*—Robert G. Clay; J. Ronald Richbourg

[57] ABSTRACT

A new and improved circuit and method for demodulating a modulated signal. The circuit of this invention includes a multivibrator switchable from one state to another in response to transitions of a modulated frequency spectrum signal, time delay means coupled between an output terminal of the multivibrator and an input terminal thereof for switching the multivibrator to a second state after a time delay determined by the time delay means, and means for shorting the time delay means after the multivibrator switches state. Thus, the means for shorting out the time delay means allows the multivibrator to be substantially immediately receptive to the next succeeding transition of the input signal.

11 Claims, 6 Drawing Figures

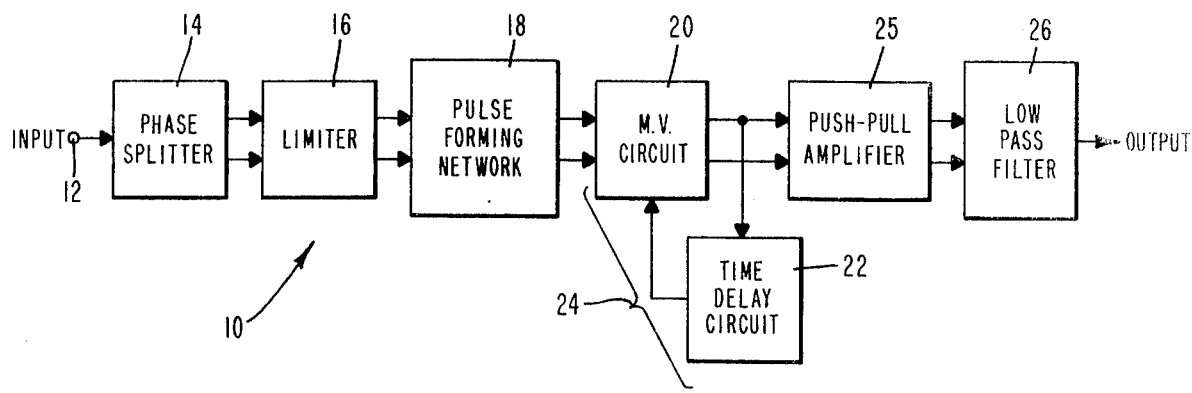
FIG_1
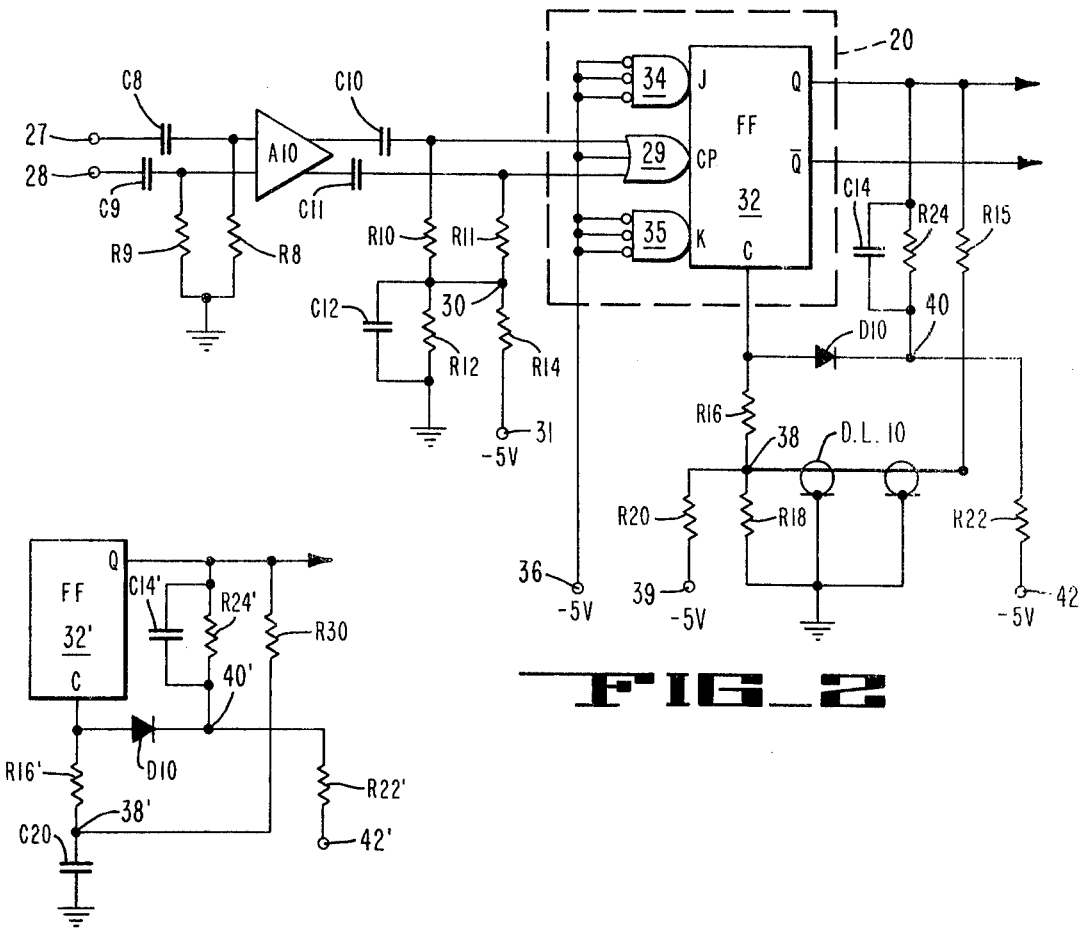
FIG_2
FIG_2A

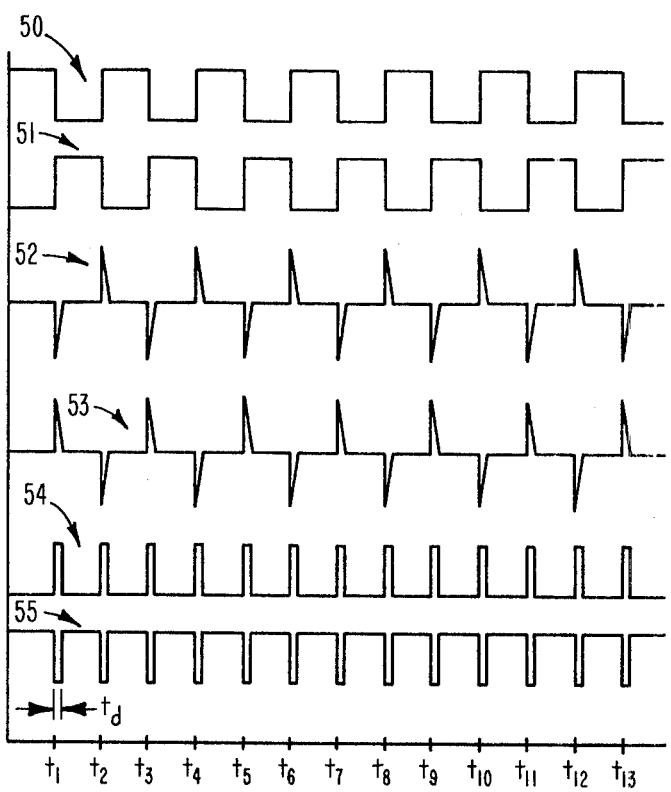
FIG_3
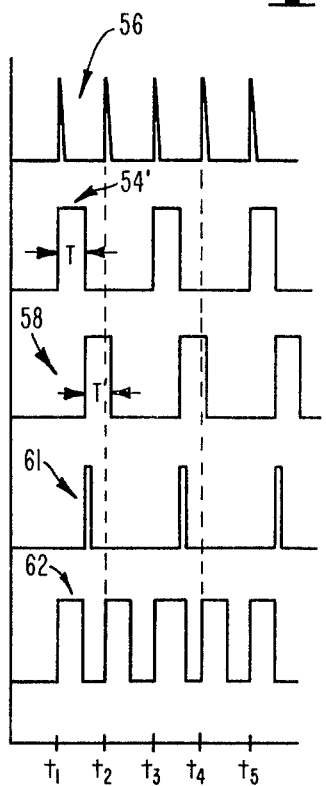
FIG_4
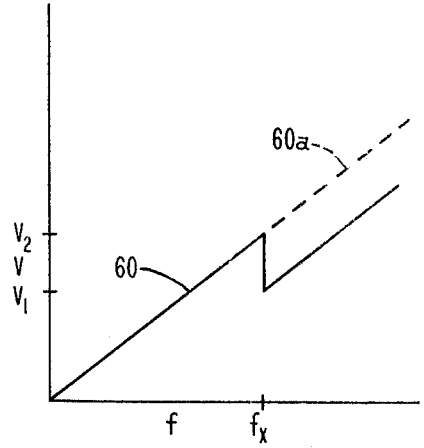
FIG_5

CIRCUIT AND METHOD FOR DEMODULATING A FREQUENCY MODULATED SIGNAL

BACKGROUND OF THE INVENTION

1. Field of the Invention

This invention relates to frequency modulation devices in general, and in particular to a new and improved demodulation circuit for use with such devices. This invention is particularly useful in magnetic recording devices. This invention also relates to a new and improved method for demodulating frequency modulated signal.

2. Prior Art

In general, there are several types of demodulation circuits in use today. The direct or pulse-counter demodulator is most often used in magnetic recording devices and in particular in video tape recorders because of its linearity over such a wide deviation.

In pulse-counter demodulators the input signal, which typically comprises an intelligence signal in the form of a spectrum of frequencies modulated on a carrier frequency is limited to produce a square-wave signal having the same or proportional frequencies as the input modulated carrier signal. This square-wave signal is used to generate pulses of a fixed pulse width T. These pulses are next phase split to produce pulses at a rate proportional to the original carrier frequency. The phase splitting step is performed either before or after the limiting step. An average value of the pulses is next extracted by means of a low-pass filter to derive the intelligence frequency spectrum from the carrier frequency spectrum.

There are various means available for generating the pulses of fixed pulse width T from the square-wave signal. One popular means is by the use of a one-shot circuit typically comprising a multivibrator having a delay line coupled between an output terminal and a clear input terminal thereof. Thus, the pulse width T is determined by the amount of time required for a voltage transition to pass through the delay line added to other propagation time delays of the constituent circuitry.

There is a problem, however, with the above-described circuit in that at high frequencies the delay line will cause the one-shot circuit to eliminate or ignore pulses which occur during the time the multivibrator is switched off. When the input signal reaches a frequency having a period of less than twice the pulse width T, transitions or pulse derived from the input signal are lost since the delayed output of the multivibrator holds the multivibrator in a clear or off state.

Avoidance of this problem has been attempted by making the pulse width T more narrow by decreasing the time delay so as to accommodate higher input frequencies. However, a reduction in the pulse width T is limited by two factors. First, the sensitivity of the demodulator is reduced by a narrow pulse width T because of lower energy per pulse, which reduces the signal-to-noise ratio of the system. Second, the pulse width T is determined by a combination of the time delay produced by a delay line and by propagation delays of the constituent components of the demodulator circuits. These components are typically temperature-sensitive, which means that the propagation time delays will vary somewhat with temperature. Accordingly, if the time delay of the delay line is shortened such that the propagation delay time is any appreciable percentage of the total time delay, then the pulse width T becomes a variable of temperature and thus becomes inaccurate. Such timing variations will result in an inaccurate demodulation of a modulated frequency spectrum signal.

SUMMARY OF THE INVENTION

The present invention provides a novel form of a pulse-counter demodulator circuit, which circuit is capable of accurately demodulating a modulated intelligence signal at frequencies substantially higher than that of similar prior art circuits.

In particular, a circuit for demodulating a signal embodying a frequency spectrum intelligence signal modulated on a carrier signal is provided, which circuit comprises means for shaping the modulated signal into a series of voltage transitions having a pulse repetition rate proportional to that of the modulated signal; a multivibrator switchable to a first state in response to the voltage transitions, the multivibrator providing a square-wave output signal at a pulse repetition rate proportional to that of the voltage transitions; time delay means coupled between an output terminal of the multivibrator and an input terminal of the multivibrator for switching the multivibrator to a second state after a time delay determined by the time delay means; means coupled in parallel with the time delay means for shorting the time delay means after the multivibrator has been switched to the second state such that the multivibrator is substantially immediately receptive to the next succeeding voltage transition; and, means for integrating the square-wave output signal from the multivibrator so as to provide the frequency spectrum signal demodulated from the carrier signal.

Further, a method of demodulating a signal embodying a frequency spectrum intelligence signal modulated on a carrier signal is provided, which method comprises the steps of shaping the modulated signal into a series of voltage transitions having a pulse repetition rate proportional to that of the modulated signal; generating a square-wave signal in response to the voltage transitions, the generating step comprising, switching a multivibrator to a first state in response to the voltage transitions; switching the multivibrator to a second state by means of a time delay means coupled between an output terminal of the multivibrator and an input terminal of the multivibrator; shorting the time delay means after the multivibrator has been switched to the second state; and, integrating the square-wave output signal from the multivibrator so as to provide the frequency spectrum signal demodulated from the carrier signal.

BRIEF DESCRIPTION OF THE DRAWINGS

FIG. 1 is a block diagram of a demodulator employing the circuit of this invention;

FIG. 2 is a more detailed schematic diagram of the pulse forming network multivibrator and delay line;

FIG. 2A is a schematic diagram of an alternate implementation of the time delay means;

FIG. 3 is a timing diagram illustrating operation of the circuit shown in FIG. 2;

FIG. 4 is a more detailed timing diagram illustrating the problem solved by this invention; and, FIG. 5 is a diagram showing a voltage versus frequency characteristic of the circuit of this invention.

DETAILED DESCRIPTION

Referring now to the drawings, and in particular to FIG. 1, a block diagram of a pulse-counter demodulator 10 is shown. The demodulator 10 is described herein as being used in a video tape recorder; however, it is noted that the demodulator is not limited to such use. A modulated signal is applied to a terminal 12 and typically comprises a frequency spectrum representing a form of intelligence modulated on a carrier frequency signal from any well-known source (not shown) of such a modulated frequency spectrum. The present invention has particular application in demodulating the intelligence signal from the modulated signal where the intelligence signal is in accordance with the number of times the modulated signal crosses the zero baseline during a given period of time. In particular, the present invention has application in demodulating both frequency and phase modulated signals, and the words "frequency modulated" as used herein refer to both of these types of modulation. Such modulation techniques are well known and will not be described further herein.

In one embodiment, the terminal 12 is coupled to the input of a phase splitter 14 to thereby produce pulses at the output thereof at twice the repetition rate of the carrier frequency, or at a rate proportional to that of the carrier frequency. The phase splitter 14 need not be coupled at the beginning of the demodulator 10 as shown, but may be coupled further downstream in the circuit. The output pulses from the phase splitter 14 are both positive and negative in polarity in response to positive and negative transitions of the input signal (i.e., twice the repetition rate of the carrier frequency).

The positive and negative pulses from the phase splitter are coupled to respective input terminals of a limiter 16, which produces square-wave signals of opposite phase but equal amplitude at output terminals thereof. The limiter 16 thus removes any amplitude variations concomitant with the transitions of the input signal.

The square-wave signals from the limiter 16 are applied to input terminals of a pulse forming or shaping network 18. Typically, the network 18 may comprise a differentiation circuit which produces sharp voltage transitions, or "spikes," in response to each voltage transition or edge of the square-wave input signal.

The spikes from the network 18 are applied to input terminals of a multivibrator (M.V.) circuit 20, which operates in conjunction with a delay circuit 22 coupled between an output terminal of the multivibrator and the clear or reset input terminal thereof, to produce pulses of a fixed time duration. Thus, the multivibrator 20 and the time delay circuit 22 operate as a one-shot circuit 24. The terms "multivibrator" and "flip-flop" are used interchangeably herein to refer to a bistable circuit well known in the art.

The output signals from the one-shot circuit 24 are balanced in both phase and amplitude, and are supplied to input terminals of a push-pull amplifier 25. Also, the pulses from the one-shot circuit are of equal amplitude and pulse width but occur with different time spacings therebetween, which time spacings represent the varying intelligence signal modulated on the carrier signal.

The amplifier 25 is also commonly referred to in such a demodulator circuit as a pulse counter, which is the basis for the name "pulse code demodulator." The amplifier 25 substantially increases the amplitude of the pulses from the one-shot circuit 24, which pulses are coupled to an input of a low pass filter 26.

The filter 26 filters out all RF components from the signal (pulses) with constant group delay, and integrates the pulses from the amplifier 25 in order to recover the composite video signal. That is, the filter 26 includes an integrator that provides a varying DC voltage at the output thereof in response to the input pulses, which DC voltage has an instantaneous amplitude proportional to the average spacing between pulses from the amplifier 25. This DC voltage thus comprises the demodulated video signal.

Referring now to FIG. 2, a detailed schematic diagram of the pulse forming network 18, multivibrator 20 and time delay circuit 22 is shown. The square-wave signals from the limiter 16 (FIG. 1) are provided on terminals 27 and 28, which terminals are coupled to one side of capacitors C8 and C9, respectively. The opposite sides of capacitors C8 and C9 are coupled to inputs of a push-pull amplifier A10, and to ground potential through resistors R8 and R9, respectively.

The capacitors C8 and C9, in conjunction with resistors R8 and R9, form a differentiation circuit that changes the square-wave signal from the limiter 16 to sharp voltage transitions or spikes.

The outputs of the amplifier A10 are coupled through capacitors C10 and C11 to two of three input terminals of an OR gate 29. In addition, the input terminals of the OR gate 29 are coupled to a circuit junction point 30 through resistors R10 and R11. The circuit junction point 30 is coupled to ground potential through a parallel resistor-capacitor (RC) network comprising a resistor R12 and a capacitor C12. Also, the circuit junction point 30 is coupled to a voltage supply on a terminal 31 through a resistor R14, which voltage supply in this embodiment is −5 volts.

It is the function of the capacitors C10 and C11 to filter out any DC components of the output from the amplifier A10. Also, it is the function of the network comprising the resistors R10, R11, R12 and R14, and the capacitor C12 to provide proper bias voltage to the input terminals of the OR gate 29. The bias voltage supplied by the above-described network provides a preset low condition for the input of the OR gate 29.

The output terminal of the OR gate 29 is coupled to the clock (CP) input of a J-K flip-flop 32. The J and K inputs are coupled to outputs of AND gates 34 and 35, respectively. The inputs of the AND gates 34 and 35 are all connected together and this connection is coupled to a voltage supply, which in this embodiment is −5V DC, provided on a terminal 36. The voltage supply terminal 36 is also coupled to the third input terminal of the OR gate 29 to bias this OR gate input at a low voltage level.

As shown in FIG. 1, an output terminal of the M.V. circuit is coupled to a clear or reset input terminal thereof through the time delay circuit 22. In particular (FIG. 2); the true (Q) output terminal of the flip-flop 32 is coupled back to the clear (C) input terminal thereof through a resistor R15, a delay line DL10, and a resistor R16. The resistor R16 is coupled to the delay line DL10 at a circuit junction point 38. In one embodiment of this invention, DL10 comprises a coaxial cable with the outer shielding coupled to ground potential. The length of the coaxial cable is proportional to the amount of the time delay. The circuit junction point 38 is coupled to ground potential through a resistor R18, and is also coupled to a voltage supply, which in this embodiment is −5 volts, provided on a terminal 39.

The time delay circuit 22 of this invention further comprises a diode D10 having the anode terminal thereof coupled to the clear (C) input terminal of the flip-flop 32. The cathode terminal of the diode D10 is coupled to a circuit junction point 40, which junction point is also coupled through a resistor R22 to a bias voltage supply provided on a terminal 42. The resistor-capacitor (RC) network, comprising a resistor R24 and a capacitor C14, is coupled between the true (Q) output terminal of the flip-flop 32 and the circuit junction point 40.

The time delay circuit 22 (FIG. 1) comprises two networks, coupled in parallel, between the Q output terminal of the flip-flop 32 and the clear (C) input terminal thereof. The first of these two networks comprises the resistor R15, the delay line DL10 and the resistor R16. The second network, coupled in parallel with the first network, comprises the parallel combination of the resistor R24 and the capacitor C14 and the diode D10, which functions to short out the first network after the flip-flop 32 changes state.

The resistors R24 and R22 form a voltage divider network which provides the proper bias potential at the cathode of the diode D10. The capacitor C14 functions as an AC short between the Q output of the flip-flop 32 and the cathode of the diode D10, and the value for C14 is made sufficiently large so as to couple the pulses from the flip-flop to the diode without any appreciable attenuation.

A positive level of the pulse at the Q output of the flip-flop is transmitted through the first network to the C input of the flip-flop after a time delay. The flip-flop is then cleared or reset once the positive level reaches the C input terminal, and a negative level of the pulse is supplied at the Q output terminal. This negative level is transmitted by the second network to the cathode of the diode D10 to forward bias the diode so as to short out the remainder of the pulse in the time delay network. The capacitor C14 functions to improve the speed at which the diode is forward biased by transmitting immediately the full unattenuated pulse level changes to the cathode of the diode.

In a specific embodiment of this invention, the flip-flop 32 is of the emitter coupled logic (ECL) type device wherein a logic zero level is approximately −1.7 volts DC potential, and a logic one level is approximately −0.8 volts DC potential. Resistor R22 is selected at 1.74 KOhms (±1% tolerance), and the resistor R24 is selected at 2 KOhms. Thus, with −5 volts supplied on the terminal 42 (in combination with the potential at the output of the flip-flop 32) the cathode of the diode D10 is maintained at a threshold potential lower than (or more negative than) either the potential for a logic zero or a logic one. For example, when the Q output of the flip-flop 32 is at a logic zero level the cathode of D10 is at approximately −3.2 volts DC, and the anode of the diode is at approximately +0.8 volts DC whereby the diode turns on so as to short out the delay line network (R15, DL10 and R16). Further, the capacitor C14 is selected to be 0.01 microfarads, which provides approximately 2 Ohms reactance at the carrier frequency of 10 MHz. This biasing arrangement at the cathode of the diode D10 improves the switching sensitivity of the circuit and assures that the diode will be immediately forward biased if the output of the flip-flop drops to a potential between −1.25 volts and −1.7 volts DC.

An alternate implementation of the delay line DL10 is shown schematically in FIG. 2A. Like reference numerals with a prime are used in FIG. 2A to illustrate like components described thus far.

A parallel resistor-capacitor network comprising resistor R24' and capacitor C14' is coupled between the true (Q) output of the flip-flop 32' and circuit junction point 40'. Resistor R22' is coupled between the circuit junction point 40' and voltage supply terminal 42'. The cathode terminal of diode D10' is coupled to the circuit junction point 40' and the anode terminal of this diode is coupled to the C input terminal of the flip-flop 32'. Resistor R16' is coupled between the C input terminal of the flip-flop 32' and circuit junction point 38'.

A resistor R30 is coupled between the Q output of the flip-flop 32' and the circuit junction point 38', and a capacitor C20 is coupled between the circuit junction point 38' and ground potential. The combination of the resistor R30 and the capacitor C20 function as a time delay, which delays coupling the transition at the Q output terminal of the flip-flop to the C input terminal. In particular, when the Q output of the flip-flop goes high a charge begings to build up on the capacitor C20. When this charge reaches the threshold level, the flip-flop is cleared or reset. Thereafter the charge on the capacitor C20 decays at the same rate. If a transition of the modulated signal is applied to the set input of the flip-flop before the capacitor C20 has discharged below the threshold level, the flip-flop will not set or change state. Accordingly, the diode D10' in combination with its concomitant biasing network will short out the charge on the capacitor C20 so as to make the flip-flop immediately receptive for the next succeeding transition of the modulated signal. The time delay circuit arrangement shown in FIG. 2, which uses a coaxial cable, is more stable in operation than the resistor-capacitor time delay circuit shown in FIG. 2A.

The operation of the above-described circuit will be more fully appreciated by reference to FIG. 3, wherein a timing diagram of such operation is shown. Waveforms 50 and 51 illustrate the square-wave output signals from the limiter 16, which signals are applied to the terminals 27 and 28 of the circuit shown in FIG. 2. These square-wave signals are shaped by the pulse forming network 18 to form sharp voltage transitions or spikes as illustrated by waveforms 52 and 53. In the illustrated embodiment, the pulse forming network comprises a pair of differentiation circuits. Thus, waveforms 52 and 53 comprise the differential of the square-wave signals illustrated by the waveforms 50 and 51, respectively.

It is noted that the square-wave signals as represented by waveforms 50 and 51, as well as all subsequent waveforms in the drawings, are illustrated at a fixed frequency for simplification of the description. During normal operation, however, the frequency varies in accordance with the frequency spectrum signal modulated on the carrier signal.

The voltage spikes (waveforms 52 and 53) are passed through the push-pull amplifier A10, wherein the negative transitions of each signal are eliminated and applied to the OR gate 29. Thus, the positive transitions of these voltage spikes at the output of the OR gate 29 clock the flip-flop 32.

When the flip-flop 32 is in a "set" or "true" state, a high-level voltage appears at the Q output terminal thereof; and, conversely, when the flip-flop is "reset" or in a "not true" state, a low-level voltage appears at the Q output terminal. The transition from a not-true to a true state of flip-flop is transmitted through the resistor R15, delay line DL10 and resistor R16 to the C input terminal of the flip-flop. However, this transition is delayed in time by the propagation delay of the flip-flop itself and for the most part by the delay line DL10. After this time delay, the transition causes the flip-flop to revert back to the reset or not-true state.

Waveforms 54 in FIG. 3 illustrates the voltage level transitions appearing at the Q output terminal of the flip-flop 32. The not $\bar{Q}$ output of the flip-flop 32 is the complement, or polar opposite, of the true output and is illustrated by waveform 55.

The problem solved by the circuit arrangement of this invention is amplified more fully with reference to the timing diagram of FIG. 4. As stated hereinabove, positive transitions of the signals from the amplifier A10 are combined by the OR gate 29 at the clock (CP) input of the flip-flop 32. Waveform 56 in FIG. 4 represents the output of the OR gate 29, or the clock (CP) input of the flip-flop 32. Waveform 54' corresponds to the Q output of the flip-flop 32 illustrated by the waveform 54 shown in FIG. 3, and has a pulse width T.

The signal appearing at the C input terminal of the flip-flop 32 is illustrated by waveform 58, which is the same as waveform 54' but delayed This time delay is represented herein by the capital letter T' and corresponds substantially to the pulse width of the signal represented by the waveform 54'. The difference between the pulse widths T and T' is the amount of propagation time delay of the circuit, which difference is relatively small compared to the total pulse width/ Thus propagation delay of the circuit, though small, accounts width. This fact that the multivibrator circuit 20 is not made immediately receptive to the next succeeding voltage transition from the pulse forming network 18, but is made substantially immediately receptive. Accordingly, the word "substantially" as used herein refers to the de minimus circuit propagation time delay.

An understanding of the present invention is facilitated by considering its operation at the occurrence of the second and fourth positive transitions of the waveform 56 at times $t_2$ and $t_4$ illustrated in FIG. 4. The flip-flop 32 is held in a clear or reset condition by the positive portions of the delayed signal illustrated by waveform 58 even in the presence of positive transitions occurring at the clock input terminal. Under these circumstances, the flip-flop would not be set at times $t_2$ and $t_4$. The failure to set the flip-flop at such times would result in an erroneous DC output by the demodulator, hence an inaccurate demodulation of the input signal. This undesirable result is illustrated by FIG. 5 and is explained further below. This problem can, however, be overcome by making the time delay T shorter; that is, making the positive pulses (waveform 54') at the Q output terminal of the flip-flop 32 shorter. This solution is unsatisfactory, as stated above, because the signal-to-noise ratio of the output signal from the low-pass filter 26 is decreased and becomes inaccurate with temperature variations.

Referring briefly to FIG. 5, the voltage versus frequency characteristic of the demodulator circuit is shown by a curve 60. In prior art pulse-counter demodulators, demodulation errors occur when the rate of occurrence of transitions of the input signal increases to have a period of less than twice the pulse width T. In FIG. 5 this is shown to occur at frequency $f_x$. Demodulation errors occur because the voltage value of the demodulator output drops from a value of $v_2$ to a value of $v_1$. This step function of the curve 60 at frequency $f_x$ is explained by the above-described phenomena, illustrated in FIG. 4, of the delayed pulse (waveform 58) holding the flip-flop 32 reset while clock input spikes are attempting to set the flip-flop.

The diode D10 in conjunction with the RC network (R24 and C14) acts to short out the delayed pulses immediately after the flip-flop 32 is reset so as to condition the flip-flop for being set again by the next succeeding positive transition at the clock input. Waveform 61 represents the clear (C) input signal after the circuit modification, and the portion 60a of the curve 60 (FIG. 5) illustrates how the overall circuit characteristic has been modified. Finally, waveform 62 represents the true (Q) output of the flip-flop 32 after the above-described circuit modification.

While my invention of a new and improved pulse-counter demodulator has been described with reference to a specific embodiment, it is understood that others skilled in the art will make modifications and changes thereto. It is therefore intended that the spirit and scope of my invention only be limited by the breadth of the appended claims.

I claim:

1. A circuit for demodulating a frequency modulated signal embodying a frequency spectrum signal modulated on a carrier signal, said circuit comprising:
    means for shaping the modulated signal into a series of voltage transitions having a pulse repetition rate proportional to that of the modulated signal;
    a multivibrator switchable to a first state in response to the voltage transitions, said multivibrator providing a square-wave output signal at a pulse repetition rate proportional to that of the voltage transitions;
    time delay means coupled between an output terminal of said multivibrator and an input terminal of said multivibrator for switching said multivibrator to a second state after a time delay determined by said time delay means;
    means coupled in parallel with said time delay means for shorting said time delay means after said multivibrator has been switched to said second state such that said multivibrator is substantially immediately receptive to the next succeeding voltage transition; and,
    means for integrating the square-wave output signal from said multivibrator so as to provide the frequency spectrum signal demodulated from the carrier signal.

2. A circuit as in claim 1 further characterized by said means for shorting said time delay means being a unidirectional current flow device.

3. A circuit as in claim 2 further characterized by means for biasing said unidirectional current flow circuit device at a threshold potential.

4. A circuit as in claim 2 further characterized by said means for shorting said time delay menas including a resistor-capacitor circuit means being coupled in series with said unidirectional current flow circuit device for improving the speed of shorting said time delay means.

5. A circuit as in claim 1 further characterized by said means for shaping including a differentiator circuit.

6. A circuit as in claim 1 further characterized by said time delay means comprising a coaxial cable.

7. A circuit as in claim 1 further characterized by said time delay means comprising an RC network.

8. A method of demodulating a frequency modulated signal embodying a frequency spectrum signal modulated on a carrier signal, said method comprising the steps of:
  a. shaping the modulated signal into a series of voltage transitions having a pulse repetition rate equal to that of the modulated signal;
  b. generating a square-wave signal in response to the voltage transitions, said generating step comprising,
    i. switching a multivibrator to a first state in response to said voltage transitions;
    ii. switching said multivibrator to a second state by means of a time delay means coupled between an output terminal of said multivibrator and an input terminal of said multivibrator;
    iii. shorting said time delay means after said multivibrator has been switched to the second state; and,
  c. integrating the square-wave output signal from said multivibrator so as to provide the frequency spectrum signal demodulated from the carrier signal.

9. A method as in claim 8 further characterized by said step of shaping including differentiating the modulated signal.

10. A method as in claim 9 further characterized by said step of switching said multivibrator to a first state comprising coupling said differentiated modulated signal to a set input terminal of said multivibrator.

11. A method as in claim 8 further characterized by said step of switching said multivibrator to the second state comprising the step of delaying in time transitions at the output of said multivibrator and coupling the delayed multivibrator output to a reset input terminal of said multivibrator.

* * * * *

UNITED STATES PATENT AND TRADEMARK OFFICE
CERTIFICATE OF CORRECTION

PATENT NO. : 4,091,330
DATED : May 23, 1978
INVENTOR(S) : Tsuneyoshi Hidaka

It is certified that error appears in the above-identified patent and that said Letters Patent are hereby corrected as shown below:

In the specification:

Column 1, line 50, change "pulse" to --pulses--.

Column 3, line 48, change "a delay" to --a time delay--.

Column 4, line 57, change ";" to -- , --.

Column 6, line 23, change "begings" to --begins--.

Column 7, line 9, change "Waveforms" to --Waveform--;

line 26, change "but delayed" to --but delayed in time.--;

line 32, change "width/" to --width,--;

line 33, change "Thus" to --This--;

line 34, change "accounts width. This" to --accounts for the fact--.

UNITED STATES PATENT AND TRADEMARK OFFICE
CERTIFICATE OF CORRECTION

PATENT NO. : 4,091,330
DATED : May 23, 1978
INVENTOR(S) : Tsuneyoshi Hidaka

It is certified that error appears in the above-identified patent and that said Letters Patent are hereby corrected as shown below:

In the specification:

Column 8, line 61, change "menas" to --means--.

*Signed and Sealed this*

*Twenty-seventh* Day of *February 1979*

[SEAL]

*Attest:*

RUTH C. MASON
*Attesting Officer*

DONALD W. BANNER
*Commissioner of Patents and Trademarks*